United States Patent [19]

Koo et al.

[11] Patent Number: 5,370,778
[45] Date of Patent: Dec. 6, 1994

[54] METHOD FOR PREPARING BASAL ORIENTED MOLYBDENUM DISULFIDE ($MoS_2$) THIN FILMS

[75] Inventors: Kwan F. Koo; Glenn L. Schrader, both of Ames, Iowa

[73] Assignee: Iowa State University Research Foundation, Inc., Ames, Iowa

[21] Appl. No.: 978,807

[22] Filed: Nov. 19, 1992

[51] Int. Cl.$^5$ .............................................. C23C 14/34
[52] U.S. Cl. ........................... 204/192.15; 204/192.16
[58] Field of Search ....................... 204/192.15, 192.16, 204/192.25

[56] References Cited

U.S. PATENT DOCUMENTS

| | | | |
|---|---|---|---|
| 4,324,803 | 4/1982 | Bergmann et al. | 204/192.15 X |
| 4,415,419 | 11/1983 | Niederhaeuser et al. | 204/192.15 |
| 5,037,516 | 8/1991 | Buck | 204/192.16 X |

OTHER PUBLICATIONS

M. Arita et al., "Investigations of Tribological Characteristics of Solid Lubricants Exposed to Atomic Oxygen", *Tribology Transactions*, 35:374–380 (1992).
Design News, "Ultra–low–friction Space Lubricant", 43:35 (Feb. 23, 1987).
P. D. Fleischauer, "Effects of Crystallite Orientation on Environmental Stability and Lubrication Properties of Sputtered $MoS_2$ Thin Films", *ASLE Transactions*, 27:82–88 (1987).
P. D. Fleishauer, "Fundamental Aspects of the Electronic Structure, Materials Properties and Lubrication Performance of Sputtered $MoS_2$ Films", *Thin Solid Films*, 154:309–322 (1987).
P. D. Fleischauer, "Chemical and Structural Effects on the Lubrication Properties of Sputtered $MoS_2$ Films", *Tribiology Transactions*, 31:239–250 (1988).
E. Furimsky, "Role of $MoS_2$ and $WS_2$ in Hydrodesulfurization", *Catal. Rev. Sci. Eng.*, 22:371–400 (1980).
M. R. Hilton et al., "TEM Lattice Imaging of the Nanostructure of Early–Growth Sputter–Deposited $MoS_2$ Solid Lubricant Films", *J. Mater. Res.*, 5:406–421 (1990).
W. Hofmann, "Thin Films of Molybdenum and Tungsten Disulphides by Metal Organic Chemical Vapour Deposition", *J. Mater. Science*, 23:3981-3986 (1988).
H. Tributsch, "Photoelectrochemical Behavior of Layer-type Transition Metal Dichalcogenides", *Faraday Discuss. Chem. Soc.*, 70:190–205 (1981).

*Primary Examiner*—Nam Nguyen
*Attorney, Agent, or Firm*—Merchant, Gould, Smith, Edell, Welter & Schmidt

[57] ABSTRACT

A method is provided to form a basal oriented coating of molybdenum sulfide of the formula $MoS_2$ on a substrate by employing the techniques of reactive sputtering comprising: (a)(i) sputtering lead (Pb) and molybdenum (Mo) from homogeneous targets of Pb and Mo in vacuo in an atmosphere of argon and hydrogen sulfide or (ii) sputtering Pb and $MoS_2$ from homogeneous targets of Pb and $MoS_2$ in an atmosphere of argon (no $H_2S$), so as to deposit a coating comprising of Pb, S and Mo on said substrate; and (b) annealing said coating at a pressure at which the Pb is lost from the coating; wherein the targets and the substrate are contained within a vacuum chamber during steps (a) and (b).

23 Claims, 3 Drawing Sheets

METHOD FOR PREPARING BASAL ORIENTED MOLYBDENUM DISULFIDE ($MoS_2$) THIN FILMS

This invention was made with the support of Contract No. ITA 87-02 between the U.S. Department of Commerce and Iowa State University. The United States government has certain rights in the invention.

BACKGROUND OF THE INVENTION

Molybdenum disulfide ($MoS_2$) is a semiconducting layered compound which has attracted much attention as a catalyst, an electrode material and a lubricant. See, for example, E. Furimsky, *Catal. Rev. Sci. Eng.*, 22, 371 (9180); D. L. Fleishaven, *Thin Solid Films*, 154, 309 (1987) and H. Tributsch, Faraday Discuss. *Chem. Soc.*, 70, 190 (1981). Lubrication of moving parts in spacecraft under high vacuum conditions presents special problems, such as the need for a lubricant exhibiting low outgassing, zero creep, wide thermal operating parameters, and the lowest possible friction. Thin films of $MoS_2$ are currently the solid lubricant of choice for high precision spaceborne applications such as satellite mechanism bearings, gears, gimbals and splines.. See, e.g., *Design News*, 43, 35 (Feb. 23, 1987).

The low shear strength of $MoS_2$ can be explained by the material's crystal structure and bonding. $MoS_2$ is comprised of hexagonally packed planes consisting of a layer of molybdenum (Mo) bounded on each side by a layer of sulfur (S). The strong bonding is within the "sandwich" or "basal" plane, and with weak van der Waals bonding between adjacent sandwich planes.

$MoS_2$ films can be prepared which exhibit different crystal orientations. Studies have been reported by P. D. Fleischauer in *ASLE Transactions*, 27, 82 (1987) and in *Tribiology Transactions*, 31, 239 (1988) on the effects of crystal orientation on environmental stability and lubrication properties of $MoS_2$. The friction mechanism of $MoS_2$ is correlated with its crystal orientation and lubricant properties. It has been found that if the crystal structures are arranged with their basal planes parallel to the substrate surface, the films will have good stability (low reactivity) and longer endurance lives than films with randomly oriented crystal structures. It is proposed that films exposing basal planes are much more resistive to oxidation (which degrades lubricant properties), because the active oxygen or water can attack the bulk of the film (by reacting with Mo center, forming $MoO_3$) only by entry through grain boundaries or breaks in the films. Furthermore, the friction and wear properties of films with basal orientations are superior, because the crystallites are initially oriented for maximum lateral slippage, whereas the randomly oriented films must suffer considerable crystallographic reorientation during the run-in or initial operation.

Although in many film deposition techniques such as rubbing or burnishing, sputtering, CVD, and laser pulsing, inorganic and organic binder-type sprays have been used to deposit $MoS_2$ films on various supports, attaining films exhibiting a single orientation in concert with meeting industrial application specifications (thickness and adhesion) is still an unaccomplished goal of the solid lubricant industries. Potentially, sputtering is a better deposition technique; it avoids the use of organic binders which can outgas under the vacuum application conditions. For aerospace lubricant applications, M. Arita et al., *Tribiology Transactions*, 35, 374 (1992) have reported that sputtered $MoS_2$ films showed the most resistance to oxidation by atomic oxygen. However, as examined by scanning electron microscopy, the crystal orientation of a typical sputter deposited $MoS_2$ film is random and exhibits "columnar" surface structures. These columnar structures provide oxidation sites (grain boundaries) which lead to rapid degradation of the deposited $MoS_2$ film.

Therefore, there is a continuing need for a method which can produce $MoS_2$ thin films that satisfy all three of the following criteria: (1) purely basal oriented; (2) stoichiometric; and (3) sufficient thickness for industrial applications such as those discussed above.

SUMMARY OF THE INVENTION

The present invention provides two embodiments of a method which employs the techniques of reactive sputtering to form coatings, which are also referred to as "films" or "thin films," of molybdenum sulfide ($MoS_2$) on a wide variety of supports.

In the first embodiment of the invention, a method is provided to form a basal-oriented coating of the formula $MoS_2$ on a substrate by employing the techniques of reactive sputtering comprising:

(a) sputtering lead (Pb) and molybdenum (Mo) from discrete targets of Pb and Mo in vacuo in an atmosphere of argon and hydrogen sulfide so as to deposit an amorphous coating comprising Pb, S and Mo on said substrate; and (b) annealing said coating in vacuo, preferably in situ, so that Pb is sublimated from the coating; wherein the targets and the substrate are contained within a vacuum chamber during steps (a) and (b), so as to yield a basal oriented coating of the formula $MoS_2$ on the substrate.

In the second embodiment of the invention, a method is provided to form a basal oriented coating of the formula $MoS_2$ on a substrate by employing the techniques of reactive sputtering comprising:

(a) sputtering lead (Pb) and molybdenum sulfide ($MoS_2$) from discrete targets of Pb and $MoS_2$ in vacuo in an atmosphere oil argon so as to deposit an amorphous coating comprising Pb, S and Mo on said substrate; and (b) annealing said coating in vacuo, preferably in situ, so that Pb is sublimated from the coating; wherein the targets and the substrate are contained within a vacuum chamber during steps (a) and (b), so as to yield a basal oriented coating of the formula $MoS_2$ on the substrate.

The resultant films and stoichiometric (S-to-Mo ratio=2) and entirely basal oriented, in that they exhibit a purely basal oriented (<002>) basal plane parallel to the substrate surface, as shown by X-ray diffraction (XRD), X-ray fluorescence (XRF) and energy dispersive X-ray spectroscopy (XRS). Scanning electron micrographs (SEM) show a dense smooth $MoS_2$ film surface morphology (non-columnar). The present methods permit a film thickness of about 0.3 $\mu$m to be attained in a 30-min deposition period. A film thickness of greater than at least about 0.1 $\mu$m is required for the industrial applications discussed hereinabove, and the present methods can readily deposit films of a wide variety of thicknesses, e.g., of about 0.20 to 10 $\mu$m, depending upon the end-use desired.

Within the context of reactive sputtering technology, the operating parameters of these two processes are quite similar. The initial sputtered coatings are formed at ambient temperature, e.g., at less than about 150° C., i.e., at about 25°–150° C. under high vacuum conditions, e.g., at about 2.5–50 mtorr, most preferably at about 3–10 mtorr (1 torr=1 mm Hg). The coatings are annealed, preferably in the vacuum chamber in which they are formed, e.g., at about 750°–850° C., under a pressure which causes essentially all of the lead (Pb) to evaporate or sublime from the initial coating, leaving the basal oriented MoS$_2$ coating on the substrate. Preferably, the annealing step is carried out under low pressure, e.g., at less than about $10^{-5}$ torr, most preferably at less than about $10^{-6}$ torr, as at $10^{-7}$ torr. Of course, higher pressures can be used in the annealing step, so long as the Pb is removed, and the desired MoS$_2$ film is formed.

Preferably, during the sputter deposition step, the argon (Ar) and, in one of the methods, hydrogen sulfide (H$_2$S) atmosphere is provided by introducing separate streams of the two gasses into the vacuum chamber at preselected flow rates, i.e., of about 15–25 sccm (standard cm$^3$/min) for H$_2$S and about 7.5–10 sccm for argon. The targets can be sputtered conventionally, e.g., with inert gas RF or DC plasmas, using sputtering guns positioned above the substrate, as shown in FIG. 1.

The type of substrate that can be coated with MoS$_2$ is not critical to the present method, so long as it can withstand the lowest useful annealing temperatures, i.e., about 450° C. Thus, useful substrates include alumina (Al$_2$O$_3$), zirconia (ZrO$_2$), sapphire, glass, and quartz, as well as various metals including molybdenum and stainless steel, and other ceramics. The substrate may be a shaped body, such as a wafer, or may be particulate.

The use of Pb during the deposition process is believed to prevent the formation of randomly oriented MoS$_2$ in the sputtering plasma. The presence of Pb during deposition may also help re-arranging the deposited MoS$_2$ materials and in the formation of the nucleation sites favoring basal crystalline growth. The post annealing thus sublimates the Pb incorporated in the films during reactive or co-sputtering deposition and results in the formation of the residual basal oriented MoS$_2$ thin films. Thus, it is believed that sputtering films of Mo and S in the presence of other volatile metals, such as Zn, Tl or Sn, followed by annealing to remove the volatile metal, will also yield basal oriented MoS$_2$ films.

DETAILED DESCRIPTION OF THE INVENTION

Figure 1:
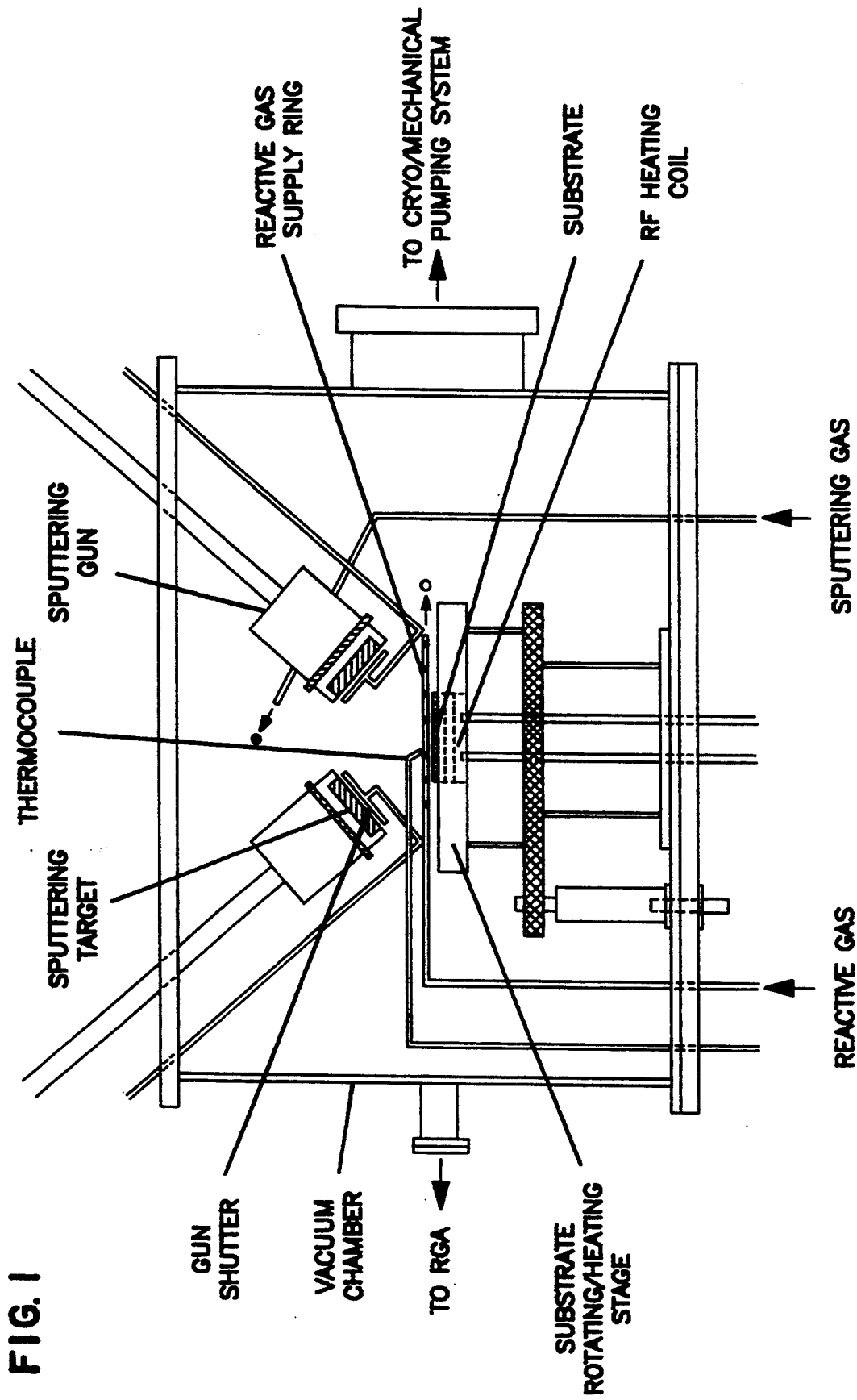
FIG. 1 is a schematic depiction of a high vacuum sputtering system used to carry out the methods of the invention.

A preferred sputtering system to carry out the present reactive sputtering methods is schematically depicted in FIG. 1 and is similar to the cryopumped, high vacuum (HV) magnetron sputtering system which is commercially available from Plasmatron, Inc. This system is equipped with two DC and one RF power source (not shown). The RF source operates at 13.56 MHz (50 ohms output impedance) and can generate up to 500 W electrical power. The two DC sources are equipped with independent voltage and current control and can operate up to 600 V and 1.5 A. Three sputtering guns (two are shown) are concentrically mounted on the top of the chamber (pneumatically operated cover plate) focusing the substrate holder. Rotatable shutters in front of each gun permit presputtering of the targets and preparation of multilayer samples.

Each gun is designed to house a 2" diameter target, and can be closed or opened via a shutter. During deposition, the target is cooled by deionized water supplied from a closed circulation system with temperature control (NESLAB Instruments, Inc.). The substrate platform is positioned in the center of the chamber, at the focal point of all 3 sputtering guns, and can be rotated at various speeds during deposition. The substrate can be cooled by recirculating deionized water or heated by an induction heater (Lepel Co.) positioned under the substrate holder. The induction heater power supply is 2.5 kW and can heat the substrate up to 1000° C. The substrate temperature is regulated by a potentiometer and monitored through a temperature display. The stainless steel chamber is 18 inches in diameter and capable of achieving a base pressure of $10^{-8}$ torr. The chamber wall can also be cooled to 18° C. by circulating water or heated to 98° C. by external heating tapes during deposition or evacuation.

An inlet tube is provided for the reactive gas (H$_2$S,→o), which can be dispersed above the substrate via a reactive gas supply ring. A flow of the sputtering gas (Ar,→.) is provided via a second inlet tube.

The invention will be further described by reference to the following detailed examples, wherein samples were prepared by reactive sputtering from Mo (99.95%, Superconductive Components), Pb (99.999% Superconductive Components) and MoS$_2$ (99.995% International Advanced Materials, Inc.) targets. H$_2$S (99,998%, Air Products) was used as the reactive gas. Ar (ultra pure carrier grad, Air Products) was used as the sputtering gas without further purification. Sintered alpha alumina plates (2"×2"−0.025" thick, McMaster-Carr Supply Co.) were used as substrates.

The bulk crystallinity and purity of MoS$_2$ thin films were determined by X-ray diffraction (XRD). XRD patterns were acquired with a Siemens D500 diffractometer using CuK$_\alpha$ radiation. A flat sample holder was used and the diffraction patterns were recorded in $2\theta$ range from 12° to 55°.

Laser Raman spectra (LRS) were recorded using a Spex 1877 Triplemate monochromator, a Spex 164 Argon ion laser operating at 514.4 nm and 200 mW measured at the source, and an EG&G OMAII data acquisition system. This technique was used to confirm the presence or absence of MoS$_2$ in the samples.

Scanning electron micrographs (SEM) were obtained on a JEOL JSM-840A scanning microscope to show microstructures of thin film/support and to determine the thickness of deposits.

Energy dispersive X-ray spectroscopy (EDS) and X-ray Fluorescence (XRF) were used to determine stoichiometry of the deposited and final annealed MoS$_2$ films. EDS was performed on a Kevex Delta V microanalyzer system. Spectra were acquired using 7.0 keV accelerating voltage, incident angle 90.0°, emergence angle 40.0°, at energy range of 0.610 to 3,340 keV. XRF was performed on a Siemens SRS 200 X-ray Spectrometer using Cr radiation operating at 20 kV, and 30 mA.

A "Scotch tape" test (Scotch Magic Tape 810, 3M) was used to determine the adhesion of the final crystalline MoS$_2$ films. Scotch tape was adhered to the film surfaces under manual pressure and peeled off immediately, then examined for the presence of any adhered MoS$_2$.

Example 1. Method 1

A sintered α-Al$_2$O$_3$ plate (2"×2"—0.025 thick, McMaster-Carr Supply Co.) was placed on a ¼" thick graphite substrate holder positioned on top of the substrate platform 10 cm from the targets. Mo and Pb were used as sputtering targets and H$_2$S was used as reactive gas. Prior to deposition, the α-Al$_2$O$_3$ plate was heated to 400° C. for 8 hrs in the sputtering chamber under vacuum (10$^{-7}$ torr) and allowed to cool to room temperature (25° C.). The targets were cleaned by pre-sputtering to shutters for 30 min before actual deposition.

The substrate was coated with an amorphous Mo-S-Pb film by reactive sputtering from targets of Mo and Pb in an H$_2$S-Ar atmosphere for 30 min. During the deposition, the following deposition parameters were used: chamber pressure: 4 mtorr; Ar gas flow rate: 8 sccm; H$_2$S gas flow rate: 20 sccm; RF-sputtering power of Mo: 120 W; DC-sputtering current for Pb: 25 mA; Substrate temperature: "ambient" (below 150° C.).

Figure 2:
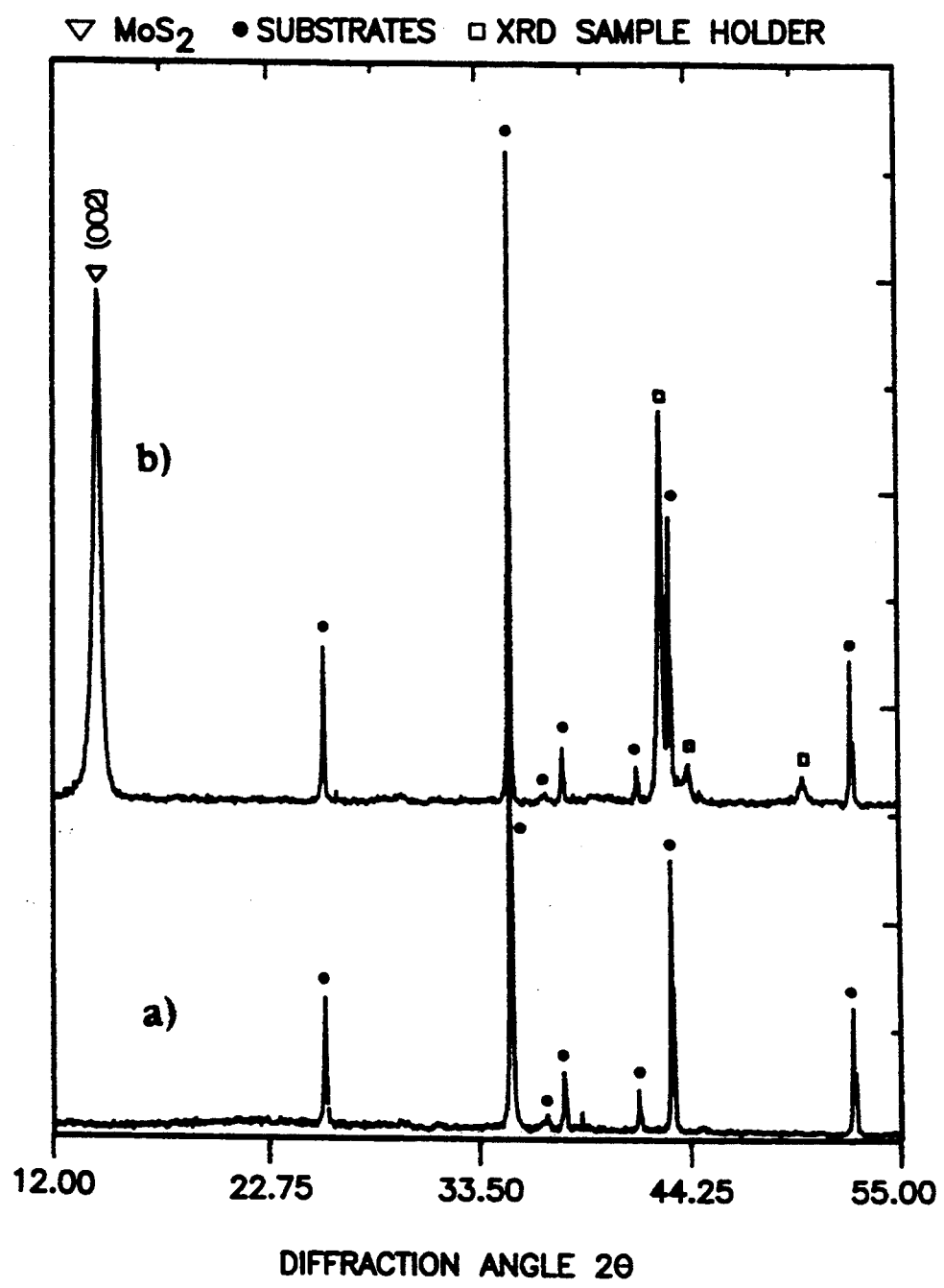
FIG. 2 is a XRD pattern of the films of Example 1 (a) before and (b) after annealing.

The deposited plate sample was cut into ⅜" wide strips and each strip was sealed in an evacuated (<10$^{-5}$ torr) quartz tube. Annealing was performed at 800° C. for 4 hours to yield basal oriented crystalline molybdenum disulfide (MoS$_2$) films. As shown in FIG. 2, panel b, the XRD pattern shows only basal MoS$_2$ (d=6.19 Å) along with alumina support reflexions. Laser Raman spectroscopy (LRS) is a sensitive technique for detecting the amorphous or crystalline MoS$_2$ (bands at 383 and 408 cm$^{-1}$). The Raman spectra confirmed the presence of MoS$_2$. Standard quantitative EDS and XRF show no Pb content in the final annealed films. The atomic ratio of S-to-Mo determined by EDS is listed in Table 1.

TABLE 1

| Stoichiometry Results of Deposited and Annealed Films | | | | |
|---|---|---|---|---|
| Method of Preparation | Pb | EDS Mo$^a$ | S | S/Mo |
| Ex. 1 (as deposited) | 4.4 | 6.0 | 20.3 | 3.4 |
| Ex. 1 (annealed) | $^c$ | 6.0 | 12.7 | 2.1 |

$^a$Normalized to Mo.
$^c$Below detection limit.

The stoichiometry of the final oriented MoS$_2$ film was comparable to bulk MoS$_2$. SEM micrographs show that the basal oriented MoS$_2$ phase appears to form continuous coatings on the α-Al$_2$O$_3$ grains. The surface of the film exhibits plate-like islands which probably resulted from nucleation. A 0.3 μm thick film could be produced in a 30-min deposition period which gave an estimated growth rate of 100 Å/min.

Example 2. Method 2

All pre-deposition conditions such as substrate material, pre-heating and pre-sputter cleaning of targets were the same as described in Example 1. In this case, MoS$_2$ and Pb were used as targets. The Mo-S-Pb coated substrate was prepared by co-sputtering from targets of MoS$_2$ and Pb in an Ar atmosphere for 30 min. The following deposition parameters were used: chamber pressure: 4 mtorr; Ar gas flow: 8 sccm; RF-sputtering power for MoS$_2$: 150 W; DC sputtering current for Pb: 25 mA; substrate temperature: "ambient" (below 150° C.). For comparison, a Mo-S layer was prepared under the same conditions by sputtering from a MoS$_2$ target in the absence of Pb.

The deposited plate sample was then cut into ⅜" wide strips and each piece was sealed in evacuated (<10$^{-4}$) quartz tubes. The strips were annealed at 800° C. for 4 hours, to yield crystalline, basal oriented MoS$_2$ films on α-Al$_2$O$_3$.

In both methods, annealing can also be performed in situ (inside the evacuated (10$^{-7}$ torr) sputtering chamber after deposition) for example, at 800° C. for 4 hrs.

Figure 3:
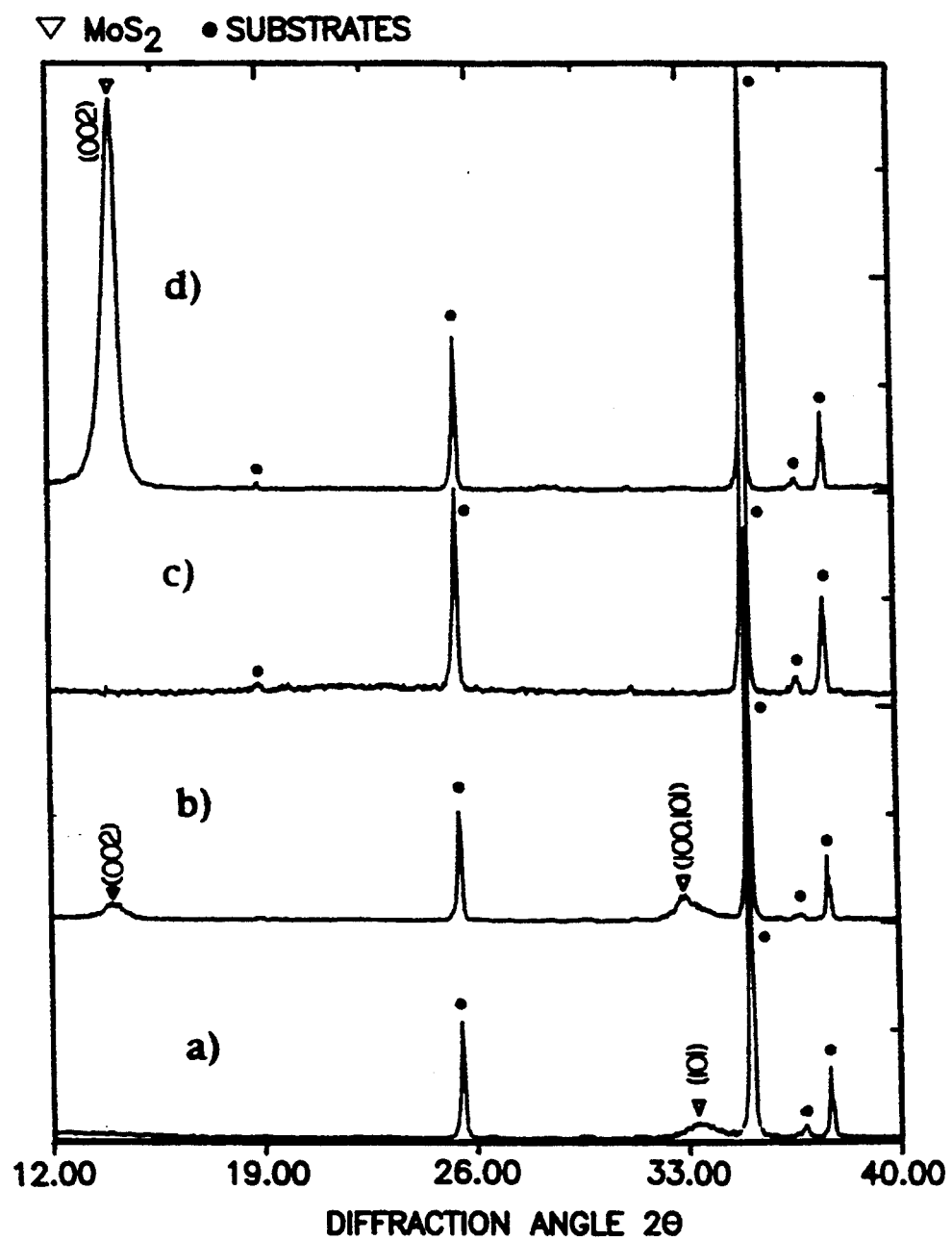
FIG. 3 depicts the XRD patterns of a film prepared using MoS$_2$ target alone; a) before and b) after annealing, and a film prepared with MoS$_2$ and Pb targets; c) before and d) after annealing.

As shown in FIG. 3, sputtering from the MoS$_2$ target alone in Ar onto ambient temperature α-Al$_2$O$_3$ substrates yielded mostly randomly oriented substoichiometric MoS$_2$. After annealing, some basal orientation of MoS$_2$ was indicated and the overall XRD peak intensities increased. In contrast, as shown in FIG. 3, using method 2, materials sputtered from targets of MoS$_2$ and Pb onto ambient temperature α-Al$_2$O$_3$ substrates were amorphous, and only substrate peaks were observed in the XRD patterns. Basal oriented single phase MoS$_2$ films were obtained after annealing, after which no other secondary phase was observed. MoS$_2$ was also confirmed by LRS. Quantitative EDS and XRF showed no Pb in the annealed film. The atomic ratio of S-to-Mo determined by XRF are given in Table 2.

TABLE 2

| Stoichiometry Results of Deposited and Annealed Films | | | | |
|---|---|---|---|---|
| Method of Preparation | Pb | XRF Mo$^a$ | S | S/Mo |
| Ex. 2 (as deposited) | 3.6 | 6.0 | 12.2 | 2.0 |
| Ex. 2 (annealed) | $^c$ | 6.0 | 12.2 | 2.0 |

$^a$Normalized to Mo.
$^c$Below detection limit.

Also, the final crystalline MoS$_2$ films prepared by both methods have passed the "Scotch tape" test. The test was performed on the same sample for 3 times consecutively. Very minute amounts (nearly invisible) of materials were observed on the detached Scotch tape after the first run. No materials were observed on the detached Scotch tapes in the later runs.

All cited publications and patents are herein incorporated by reference to the same extent as if each individual publication or patent application was specifically and individually indicated to be incorporated by reference.

It will be apparent to one of ordinary skill in the art that many changes and modifications can be made in the invention without departing from the spirit or scope of the appended claims.

What is claimed is:

1. A method to form a basal oriented coating of the formula MoS$_2$ on a substrate by employing the techniques of reactive sputtering comprising:
   (a) sputtering lead (Pb) and molybdenum (Mo) from discrete targets of Pb and Mo in vacuo in an atmosphere of argon and hydrogen sulfide so as to deposit an amorphous coating comprising Pb, S and Mo on said substrate; and
   (b) annealing said coating in vacuo so that the Pb is sublimated from the coating; wherein the targets and the substrate are contained within a vacuum chamber during steps (a) and (b), so as to yield a basal oriented coating of the formula MoS$_2$ on the substrate.

2. The method of claim 1 wherein step (a) is carried out at a temperature of less than 150° C.

3. The method of claim 1 wherein the sputtering is carried out at a pressure between 2.5–50 mtorr.

4. The method of claim 3 wherein the sputtering is carried out at a pressure between 3–10 mtorr.

5. The method of claim 1 wherein a stream of hydrogen sulfide is introduced into the vacuum chamber at between 10–25 sccm during step (a).

6. The method of claim 1 wherein a stream of argon is introduced into the vacuum chamber at between 7.5–10 sccm during step (a).

7. The method of claim 1 wherein the coating is annealed at a temperature between 750°–850° C. in vacuo in step (b).

8. The method of claim 7 wherein the coating is annealed at a pressure less than $10^{-5}$ torr in step (b).

9. The method of claim 7 wherein the coating is annealed at a pressure less than $10^{-6}$ torr in the vacuum chamber employed in step (a).

10. The method of claim 1 wherein the substrate is heated to a temperature between 350°–500° C. in vacuo prior to step (a).

11. The method of claim 1 wherein the substrate is selected from the group consisting of alumina, zirconia, quartz, molybdenum and stainless steel.

12. The method of claim 11 wherein the substrate is an $\alpha$-Al$_2$O$_3$ plate.

13. A method to form a basal oriented coating of the formula MoS$_2$ on a substrate by employing the techniques of reactive sputtering comprising:
 (a) sputtering lead (Pb) and molybdenum sulfide MoS$_2$ from discrete targets of Pb and MoS$_2$ in vacuo in an atmosphere of argon so as to deposit an amorphous coating comprising Pb, S and Mo on said substrate; and
 (b) annealing said coating in vacuo so that the Pb is sublimated from the coating; wherein the targets and the substrate are contained within a vacuum chamber during steps (a) and (b), so as to yield a basal oriented coating of the formula MoS$_2$ on the substrate.

14. The method of claim 13 wherein step (a) is carried out at a temperature of less than 150° C.

15. The method of claim 13 wherein the sputtering is carried out at a pressure between 2.5–50 mtorr.

16. The method of claim 15 wherein the sputtering is carried out at a pressure between 3–10 mtorr.

17. The method of claim 13 wherein a stream of argon is introduced into the vacuum chamber at between 7.5–10 sccm during step (a).

18. The method of claim 13 wherein the coating is annealed at a temperature between 750°–850° C. in vacuo in step (b).

19. The method of claim 18 wherein the coating is annealed at a pressure of less than $10^{-4}$ torr in step (b).

20. The method of claim 19 wherein the coating is annealed at a pressure of less than $10^{-6}$ torr in the vacuum chamber employed in step (a).

21. The method of claim 13 wherein the substrate is heated to a temperature between 350°–500° C. in vacuo prior to step (a).

22. The method of claim 13 wherein the substrate is selected from the group consisting of alumina, zirconia, quartz, molybdenum and stainless steel.

23. The method of claim 22 wherein the substrate is an $\alpha$-Al$_2$O$_3$ plate.

* * * * *